(12) United States Patent
Yoo

(10) Patent No.: US 10,180,873 B2
(45) Date of Patent: Jan. 15, 2019

(54) SEMICONDUCTOR MEMORY DEVICE AND METHOD FOR OPERATING THE SAME

(71) Applicant: SK hynix Inc., Gyeonggi-do (KR)

(72) Inventor: Deung Kak Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/642,896

(22) Filed: Jul. 6, 2017

(65) Prior Publication Data

US 2018/0157546 A1    Jun. 7, 2018

(30) Foreign Application Priority Data

Dec. 2, 2016 (KR) .......................... 10-2016-0163668

(51) Int. Cl.
*G06F 11/07* (2006.01)

(52) U.S. Cl.
CPC ........ *G06F 11/079* (2013.01); *G06F 11/0727* (2013.01); *G06F 11/0751* (2013.01); *G06F 11/0772* (2013.01)

(58) Field of Classification Search
CPC ............... G06F 11/079; G06F 11/0727; G06F 11/0751; G06F 11/0772
See application file for complete search history.

(56) References Cited

U.S. PATENT DOCUMENTS

| 5,598,368 A * | 1/1997 | Takahashi | G11C 16/16 365/185.01 |
| 7,057,937 B1 * | 6/2006 | Matsubara | G11C 16/102 365/185.01 |
| 2016/0260496 A1 * | 9/2016 | Yoon | G11C 16/3445 |

FOREIGN PATENT DOCUMENTS

| KR | 101184866 | 9/2012 |
| KR | 1020130072668 | 7/2013 |

* cited by examiner

*Primary Examiner* — Mohammed A Bashar
(74) *Attorney, Agent, or Firm* — IP & T Group LLP

(57) ABSTRACT

Provided herein may be a semiconductor memory device and a method for operating the same. The semiconductor memory device may include a memory cell array, a peripheral circuit, control logic, a status storage unit, and an operating characteristic checking unit. The memory cell array may include memory cells. The peripheral circuit may perform an operation for writing data to the memory cell array, reading data from the memory cell array, or erasing data written to the memory cell array. The control logic may control the peripheral circuit so that a data write operation, a data read operation or a data erase operation is performed. The status storage unit may store an operational status of the memory cell array as a first status value. The operating characteristic checking unit may receive an operating characteristic value, and generate a second status value via a comparison with an operation threshold value.

20 Claims, 7 Drawing Sheets

SEMICONDUCTOR MEMORY DEVICE AND METHOD FOR OPERATING THE SAME

CROSS-REFERENCE TO RELATED APPLICATION

The present application claims priority under 35 U.S.C. § 119(a) to Korean patent application number 10-2016-0163668 filed on Dec. 2, 2016 in the Korean Intellectual Property Office, the entire disclosure of which is incorporated herein by reference.

BACKGROUND

Field of Invention

Various embodiments of the present disclosure may generally relate to an electronic device, and more particularly, to a semiconductor memory device and a method for operating the semiconductor memory device.

Description of Related Art

Semiconductor memory devices are memory devices realized using a semiconductor such as silicon (Si), germanium (Ge), gallium arsenide (GaAs), indium phosphide (InP), or the like. Semiconductor memory devices are classified into volatile memory devices and nonvolatile memory devices.

The volatile memory device is a memory device in which data stored therein is lost when its power supply is interrupted. Representative examples of the volatile memory device include a static random access memory (RAM) (SRAM), a dynamic RAM (DRAM), and a synchronous DRAM (SDRAM). The nonvolatile memory device is a memory device in which data stored therein is retained even when its power supply is interrupted. Representative examples of the nonvolatile memory device include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). The flash memory is classified into a NOR type memory and a NAND type memory.

SUMMARY

Various embodiments of the present disclosure are directed to a semiconductor memory device, which can improve the reliability of operation.

Various embodiments of the present disclosure are directed to a method for operating a semiconductor memory device, which can improve the reliability of operation.

An embodiment of the present disclosure may provide for a semiconductor memory device. The semiconductor memory device may include a memory cell array, a peripheral circuit, control logic, a status storage unit, and an operating characteristic checking unit. The memory cell array may include a plurality of memory cells. The peripheral circuit may be configured to perform a data write operation, a data read operation or a data erase operation on the memory cell array. The control logic may be configured to control the peripheral circuit so that the data write operation, the data read operation or the data erase operation is performed on the memory cell array. The status storage unit may be configured to store a status of an operation on the memory cell array as a first status value. The operating characteristic checking unit may be configured to receive an operating characteristic value depending on the operation on the memory cell array, and generate a second status value by comparing the operating characteristic value with an operation threshold value.

In an embodiment, when the first status value is a value indicating an operation success, and the second status value is a value indicating an operation success, the operation on the memory cell array may be determined to have succeeded.

In an embodiment, when any one of the first status value and the second status value is a value indicating an operation failure, the operation on the memory cell array may be determined to have failed.

In an embodiment, the first status value may be output to a controller using a status read operation.

In an embodiment, the operating characteristic checking unit may include an operation threshold storage unit and a threshold comparison unit. The operation threshold storage unit may be configured to store the operation threshold value. The threshold comparison unit may be configured to receive the operating characteristic value, and generate an operating characteristic checking result by comparing the received operating characteristic value with the operation threshold value.

In an embodiment, the threshold comparison unit may output the operating characteristic checking result as the second status value.

In an embodiment, the operating characteristic value may include a number of applications of an operation pulse for the operation of the memory cell array, and the operation threshold value may include a threshold number of applications of the operation pulse. In this case, the threshold comparison unit may be configured to output a value indicating to an operation failure as the second status value when the number of applications of the operation pulse is less than the threshold number of applications. Further, the threshold comparison unit may be configured to output a value indicating an operation success as the second status value when the number of applications of the operation pulse is less than the threshold number of applications.

In an embodiment, the status of the operation may include a status of a program operation of the memory cell array. Further, the operation pulse may be a program pulse that is applied for the program operation of the memory cell array, and the operating characteristic value may include a number of applications of the program pulse. Furthermore, the operation threshold value may include a threshold number of applications of the program pulse.

In an embodiment, the operating characteristic value may include an application time of an operating voltage for the operation on the memory cell array, and the operation threshold value may include a threshold application time of the operating voltage. In this case, the threshold comparison unit may be configured to output a value indicating an operation failure as the second status value when the application time of the operating voltage is shorter than the threshold application time. Further, the threshold comparison unit may be configured to output a value indicating an operation success as the second status value when the application time of the operating voltage is equal to or longer than the threshold application time.

In an embodiment, the status of the operation may include a status of an erase operation of the memory cell array, and the operating voltage may be an erase voltage that is applied to erase data written to the memory cell array. Further, the operating characteristic value may include an application time of the erase voltage, and the operation threshold value may include a threshold application time of the erase voltage.

In an embodiment, the first status value and the second status value may be output in response to a request signal from an external controller.

In an embodiment, when the first status value is a value indicating an operation success, and the second status value is a value indicating an operation failure, the control logic may convert the first status value into a value indicating an operation failure in response to a request signal from an external controller, and output the converted first status value to the controller.

An embodiment of the present disclosure may provide for a method of operating a semiconductor memory device. The method may include a first checking step of checking a status of an operation on the semiconductor memory device using a status read operation for the semiconductor memory device, a second checking step of checking a status of an operation on the semiconductor memory device by comparing an operating characteristic value of the semiconductor memory device with an operation threshold value, and an operation determining step of determining an operation status of the semiconductor memory device based on a result of the first checking step and a result of the second checking step.

In an embodiment, the first checking step may include checking, by a controller, the status of the operation on the semiconductor memory device by performing a status read operation on the semiconductor memory device.

In an embodiment, the operation determining step may include determining that the operation of the semiconductor memory device has succeeded when it is checked that the operation of the semiconductor memory device has succeeded at the first checking step, and it is checked that the operation of the semiconductor memory device has succeeded at the second checking step.

In an embodiment, the operation determining step may include determining that the operation of the semiconductor memory device has failed when it is checked that the operation of the semiconductor memory device has failed at any one of the first checking step and the second checking step.

In an embodiment, the operating characteristic value may include a number of applications of an operation pulse for an operation of a memory cell in the semiconductor memory device, and the operation threshold value may include a threshold number of applications of the operation pulse. In this case, the second checking step may include checking that the operation of the memory cell has failed when the number of applications of the operation pulse is less than the threshold number of applications, and checking that the operation of the memory cell has succeeded when the number of applications of the operation pulse is equal to or greater than the threshold number of applications.

In an embodiment, the operational status of the semiconductor memory device may include a status of a program operation, and the operation pulse may be a program pulse for programming data in the memory cell in the semiconductor memory device. Further, the operating characteristic value may include a number of applications of the program pulse, and the operation threshold value may include a threshold number of applications of the program pulse.

In an embodiment, the operating characteristic value may include an application time of an operating voltage for an operation of a memory cell in the semiconductor memory device, and the operation threshold value may include a threshold application time of the operating voltage. In this case, the second checking step may include check that the operation of the memory cell has failed when the application time of the operating voltage is shorter than the threshold application time, and check that the operation of the memory cell has succeeded when the application time of the operating voltage is equal to or longer than the threshold application time.

In an embodiment, the operational status of the semiconductor memory device may include a status of an erase operation, and the operating voltage may be an erase voltage that is applied to erase data written to the memory cell in the semiconductor memory device. Further, the operating characteristic value may include an application time of the erase voltage, and the operation threshold value may include a threshold application time of the erase voltage.

DETAILED DESCRIPTION

Figure 1:
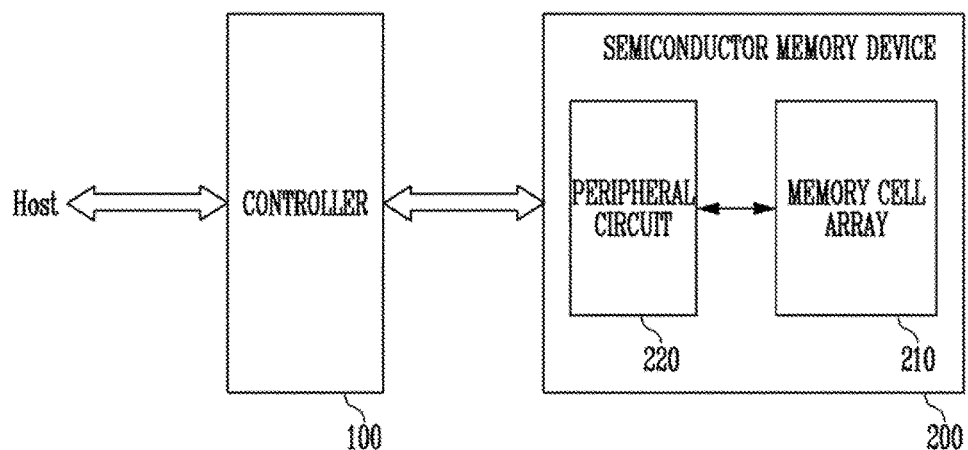
FIG. 1 is a block diagram illustrating a semiconductor system including a semiconductor memory device and a controller according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural form as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. Alternatively, "directly connected/directly coupled" refers to one component directly coupling another component without an intermediate component.

FIG. 1 is a block diagram illustrating a semiconductor system including a semiconductor memory device and a controller according to an embodiment of the present disclosure.

Referring to FIG. 1, the semiconductor system 10 may include a controller 100 and a semiconductor memory device 200. Further, the semiconductor system 10 may be coupled to a host Host which is a user device.

The semiconductor memory device 200 may be a device which is operated in response to the control of the controller 100. The semiconductor memory device 200 may be provided as an integrated circuit in at least one chip, and may be configured to perform a specific operation under the control of the controller 100. For example, the semiconductor memory device 200 may be provided as a nonvolatile memory device or a volatile memory device. Here, the semiconductor memory device 200 may be implemented as a solid state disk or drive (SSD), a PC card (e.g., personal computer memory card international association (PCMCIA)), a compact flash card (CFC), a smart media card (SMC), a memory stick, a multimedia card (e.g., MMC, RS-MMC or MMC-micro), a secure digital card (e.g., SD, miniSD, microSD, or SDHC) or a universal flash storage (UFS).

The semiconductor memory device 200 may include a memory cell array 210 and a peripheral circuit 220.

The memory cell array 210 may include a plurality of memory cells. The peripheral circuit 220 may be configured to perform a program operation, a read operation, and an erase operation on the memory cell array 210 in response to a command from the controller 100. During a program operation, the peripheral circuit 220 may receive data from the controller 100 and may store the received data in memory cells selected from the memory cell array 210. During a read operation, the peripheral circuit 220 may read data stored in memory cells selected from the memory cell array 210, and may output the read data to the controller 100. During an erase operation, the peripheral circuit 220 may erase data stored in memory cells selected from the memory cell array 210.

The controller 100 may be coupled between the host Host and the semiconductor memory device 200. The controller 100 may transmit a command to the semiconductor memory device 200 in response to a request from the host. The semiconductor memory device 200 may execute the received command. The host may be implemented as a device such as a personal or portable computer, a personal digital assistant (PDA), a portable media player (PMP), or an MP3 player. The host and the semiconductor system 10 may be coupled to each other through a standardized interface such as a universal serial bus (USB) interface, a small computer system interface (SCSI), an enhanced small disk interface (ESDI), a serial advanced technology attachment (SATA) interface, a serial attached SCSI (SAS), a peripheral component interconnection express (PCIe) interface, or an integrated drive electronics (IDE) interface.

In an embodiment, the controller 100 may control the semiconductor memory device 200 so that a program operation, a read operation or an erase operation is performed in response to a request from the host Host. During a program operation, the controller 100 may provide a command corresponding to the program operation hereinafter referred to as a "program command", an address for the program operation, and data to the semiconductor memory device 200. The semiconductor memory device 200 may store the data in memory cells indicated by the address for the program operation. During a read operation, the controller 100 may provide a command corresponding to the read operation hereinafter referred to as a "read command" and an address for the read operation to the semiconductor memory device 200. The semiconductor memory device 200 may read data from memory cells indicated by the address and may output the read data to the controller 100. During an erase operation, the controller 100 may provide a command corresponding to the erase operation hereinafter referred to as an "erase command" and an address for the erase operation to the semiconductor memory device 200. The semiconductor memory device 200 may erase data stored in memory cells indicated by the address for the erase operation.

The controller 100 may transmit a command to the semiconductor memory device 200, and may then check whether the performance of an operation corresponding to the command has been completed. Further, the controller 100 may check whether the performance of the operation corresponding to the command has succeeded or failed. For this checking, after transmitting the command, the controller 100 may perform a status read operation on the semiconductor memory device 200. When the controller 100 sends a status read signal to the semiconductor memory device 200, the semiconductor memory device 200 may provide a status read response signal to the controller 100. The semiconductor memory device 200 may transfer information about whether the operation corresponding to the command has been completed, whether the operation corresponding to the command is currently being performed, or whether the operation corresponding to the command has succeeded or failed, through the status read response signal. Furthermore, the semiconductor memory device 200 may output a value, stored in a status storage unit (not illustrated) included therein, as the status read response signal. A detailed description of the status storage unit will be made later with reference to FIG. 2.

Figure 2:
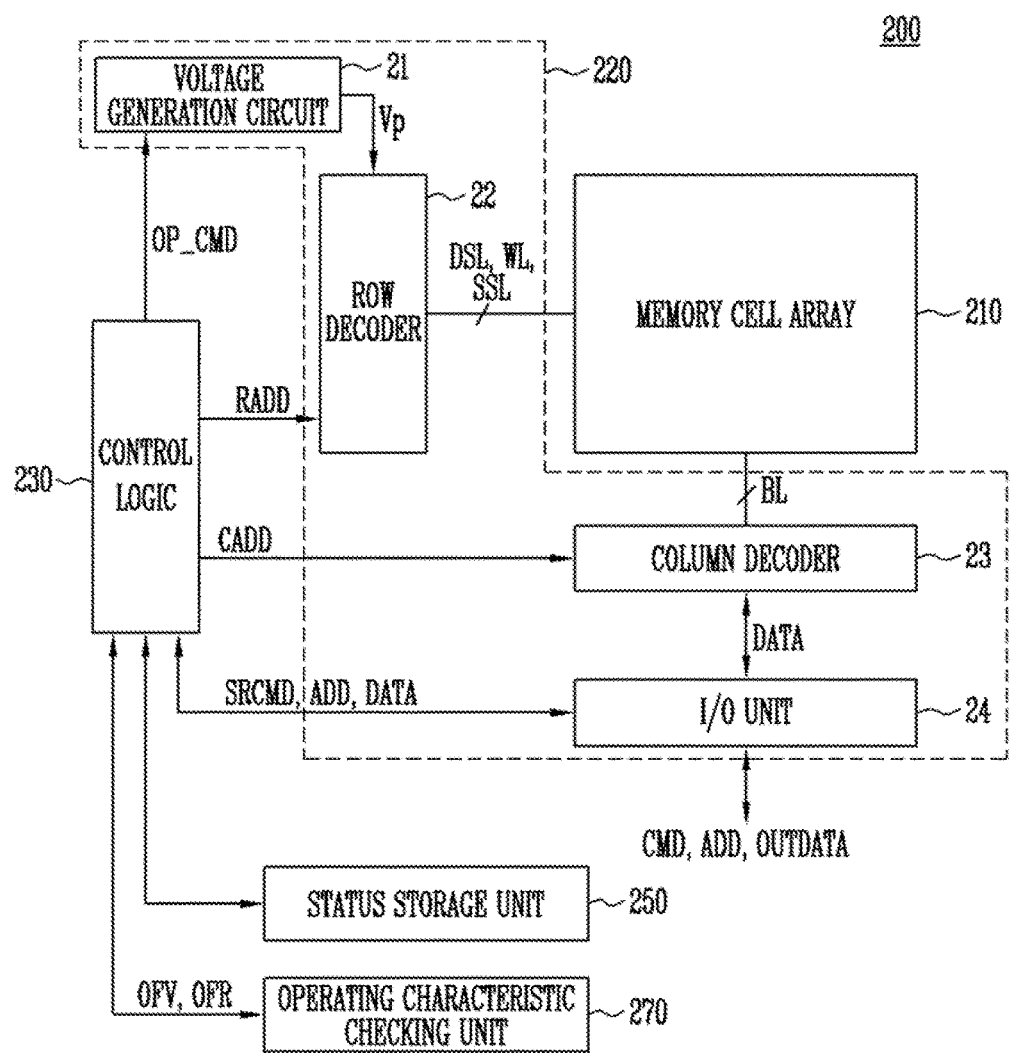
FIG. 2 is a block diagram illustrating a semiconductor memory device according to an embodiment of the present disclosure.

FIG. 2 is a block diagram illustrating a semiconductor memory device 200 according to an embodiment of the present disclosure.

Referring to FIG. 2, the semiconductor memory device 200 may include a memory cell array 210 configured to store data therein, a peripheral circuit 220 configured to perform an erase operation, a program operation, and/or a read operation on the memory cell array 210, and a control logic 230 configured to control the peripheral circuit 220. The semiconductor memory device 200 according to an embodiment of the present disclosure may further include a status storage unit 250 configured to store the operational status of the memory cell array 210, and an operating characteristic checking unit 270 configured to check the operating characteristics of the memory cell array 210. A description will be made by referring to a flash memory device by way of example.

The memory cell array 210 may include a plurality of memory blocks (not illustrated), and each of the memory blocks may include a plurality of cell strings (not illustrated). For example, the cell strings may include drain select transistors, memory cells, and source select transistors, and are coupled to bit lines BL. The gates of the drain select transistors are coupled to drain select lines DSL, the gates of the memory cells are coupled to word lines WL, and the gates of the source select transistors are coupled to source select lines SSL.

The peripheral circuit 220 may include a voltage generation circuit 21, a row decoder 22, a column decoder 23, and an input/output (I/O) unit 24.

The voltage generation circuit 21 may generate operating voltages Vp required for various types of operations in response to an operation command OP_CMD from the control logic 230. For example, the voltage generation circuit 21 may generate an erase voltage, a program voltage, a read voltage, etc. as the operating voltages Vp.

The row decoder 22 may transfer the operating voltages Vp to drain select lines DSL, word lines WL, and source select lines SSL which are coupled to a memory block selected from among the plurality of memory blocks included in the memory cell array 210 in response to a row address RADD from the control logic 230.

The column decoder 23 may exchange data with the memory cell array 210 in response to a column address CADD from the control logic 230.

The I/O unit 24 may receive a command CMD and an address ADD from the outside (e.g., the controller 100 of FIG. 1) of the semiconductor memory device 200, transfer a status checking command SRCMD and the address ADD to the control logic 230, and exchange data with the control logic 230 or the column decoder 23. During a status checking operation, the I/O unit 24 may receive data DATA including an operation code and various types of information from the control logic 230 and may output the received data and information as final data OUTDATA.

The control logic 230 may output the operation command OP_CMD, the row address RADD, the column address CADD, and data DATA in response to the status checking command SRCMD or commands related to various operations, and the address ADD.

The status storage unit 250 may store the operational status of the memory cell array 210 as a first status value (not illustrated). The first status value may be a status value indicating whether a specific operation of the memory cell array 210, for example, a program operation or an erase operation, has succeeded or failed. The first status value may be transferred to the control logic 230. The first status value transferred to the control logic 230 may be transmitted, as a status read response signal, to the controller 100 via the I/O unit 24. Generally, whether the operation corresponding to the command has succeeded or failed may be determined by checking the first status value. Typically, the first status value may be stored as a value indicating an "operation success (PASS)" as a default value, and may be updated with a value indicating an "operation failure (FAIL)" when the operation is not yet completed or when malfunctioning or the like occurs during the performance of the corresponding operation. In some situations, for example, in a situation in which a supply voltage is not desirably supplied, there may occur a case where the first status value is not updated with a value indicating an "operation failure" even when the performance of the operation corresponding to the received command is not normally completed. In this case, although the performance of the operation corresponding to the command has failed, the first status value transferred as the status read response signal to the controller 100 may have a value indicating an "operation success". Therefore, in the above-described situation, the reliability of the operation of the semiconductor memory device may be deteriorated.

The semiconductor memory device according to an embodiment of the present disclosure may generate a second status value indicating whether the corresponding operation has been normally performed, through the operating characteristic checking unit 270. Even if the operation corresponding to the command has not been normally performed as in the above case, the first status value stored in the status storage unit 250 may have a value indicating an "operation success", but, in this case, the operating characteristic checking unit 270 may additionally check the status, thus enabling the operation to be more reliably checked.

The operating characteristic checking unit 270 may receive an operating characteristic value OFV corresponding to the specific operation of the memory cell array 210. The operating characteristic checking unit 270 may generate an operating characteristic checking result OFR by comparing the received operating characteristic value OFV with an operation threshold value stored therein. The operating characteristic checking result OFR may have any one of a value indicating an "operation success" and a value indicating an "operation failure". The operating characteristic checking result OFR may be transferred as a second status value to the control logic 230. The control logic 230 may convert the first status value with reference to the operating characteristic checking result OFR which is the second status value. For example, when the first status value is a value indicating an "operation success" and that the second status value is a value indicating an "operation failure", the control logic 230 may convert the first status value into a value indicating an "operation failure", and may then transfer the converted value as a status read response signal to the controller 100 through the I/O unit 24.

In other embodiments, the second status value may be directly transferred to the controller 100 via the I/O unit 24. The controller 100 may determine whether the specific operation of the memory cell array 210 has succeeded or failed in consideration of both the first status value and the second status value. The controller 100 may determine that the specific operation of the memory cell array 210 has succeeded only if both the first status value and the second status value are values indicating an "operation success". For example, when the first status value is a value indicating an "operation success" and the second status value is a value indicating an "operation failure", the controller 100 may determine that the operation of the memory cell array 210 has failed. In other embodiments, when the first status value is a value indicating an "operation failure" and the second status value is a value indicating an "operation success", the controller 100 may also determine that the operation of the memory cell array 210 has failed. The determination of whether the operation has succeeded or failed depending on the first status value and the second status value will be described in detail later with reference to FIGS. 4 to 7.

In an embodiment, the operating characteristic value OFV may be a value indicating the number of applications of an operation pulse which is applied for a specific operation of the memory cell array 210. For example, the operation of the memory cell array 210 may be a program operation. In this case, the operating characteristic value OFV may be a value indicating the number of applications of a program pulse. The operating characteristic checking unit 270 may compare the number of applications of a received program pulse with the threshold number of applications, which is stored therein. When the number of applications of the received program pulse is less than the threshold number of applications, the operating characteristic checking unit 270 may transfer a value indicating an "operation failure" as the operating characteristic checking result OFR to the control logic 230. Further, when the number of applications of the received program pulse is equal to or greater than the threshold number of applications, the operating characteristic checking unit 270 may transfer a value indicating an "operation success" as the operating characteristic checking result OFR to the control logic 230. The generation of the operating characteristic checking result OFR related to the above-described program operation will be described later with reference to FIGS. 4 to 6. In the above-described example, although the operation characteristic value OFV is described as indicating the number of applications of the program pulse, the number of applications of another specific voltage pulse may also be defined as the operating characteristic value OFV.

In other embodiments, the operating characteristic value OFV may be a value indicating the time during which an operating voltage for a specific operation of the memory cell array 210 is applied. For example, the specific operation of the memory cell array 210 may be an erase operation. In this case, the operating characteristic value OFV may be a value indicating the time during which an erase voltage is applied. The operating characteristic checking unit 270 may compare the application time of a received erase voltage with a threshold application time stored therein. Here, when the application time of the received erase voltage is shorter than the threshold application time, the operating characteristic checking unit 270 may transfer a value indicating an "operation failure" as the operating characteristic checking result OFR to the control logic 230. Further, when the application time of the received erase voltage is equal to or longer than the threshold application time, the operating characteristic checking unit 270 may transfer a value indicating an "operation success" for the erase operation as the operating characteristic checking result OFR to the control logic 230. The generation of the operating characteristic checking result OFR related to the above-described erase operation will be described later with reference to FIG. 7. In the above-described example, although the operating characteristic value OFV is described as being a value indicating the application time of the erase voltage, the application time of another specific voltage may also be defined as the operating characteristic value OFV.

Figure 3:
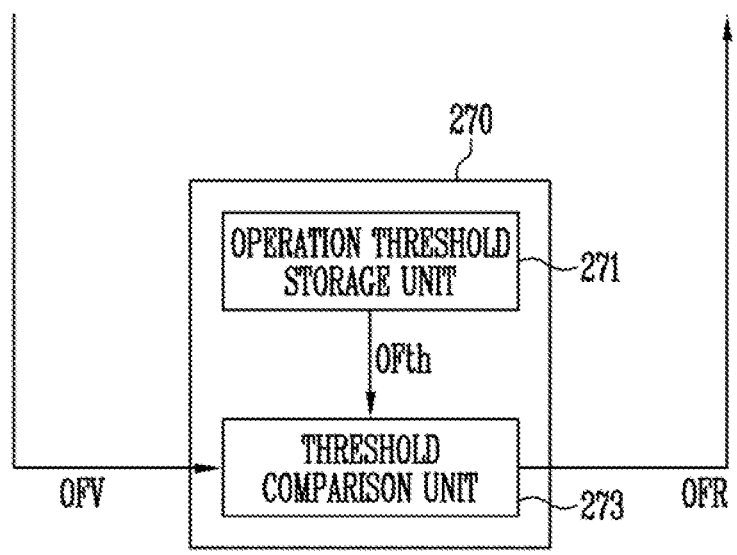
FIG. 3 is a block diagram illustrating an operating characteristic checking unit according to an embodiment of the present disclosure.

FIG. 3 is a block diagram illustrating the operating characteristic checking unit 270 illustrated in FIG. 2 according to an embodiment of the present disclosure.

Referring to FIG. 3, the operating characteristic checking unit 270 may include an operation threshold storage unit 271 and a threshold comparison unit 273. The operation threshold storage unit 271 may store an operation threshold value OFth related to a specific operation of the memory cell array 210. The threshold comparison unit 273 may receive an operating characteristic value OFV related to the specific operation of the memory cell array 210 from the control logic 230. Further, the threshold comparison unit 273 may receive the operation threshold value OFth stored in the operation threshold storage unit 271. The threshold comparison unit 273 may generate an operating characteristic checking result OFR by comparing the received operating characteristic value OFV with the operation threshold value OFth, and may transfer the operating characteristic checking result OFR to the control logic 230. In an embodiment, when the received operating characteristic value OFV is less than the operation threshold value OFth, the threshold comparison unit 273 may generate a value indicating an "operation failure" as the operating characteristic checking result OFR. When the received operating characteristic value OFV is equal to or greater than the operation threshold value OFth, the threshold comparison unit 273 may generate a value indicating an "operation success" as the operating characteristic checking result OFR. The operating characteristic checking result OFR may be output as a second status value to the control logic 230.

When the operation of the memory cell array 210 is a program operation, the operating characteristic value OFV may be a value indicating the actual number of applications of a program pulse. Further, the operation threshold value OFth may be the threshold number of applications of the program pulse, which is a reference value used for comparison. Alternatively, according to some embodiments, the number of applications of an additional voltage pulse other than the program pulse may be defined as the operating characteristic value OFV.

When the operation of the memory cell array 210 is an erase operation, the operating characteristic value OFV may be a value indicating the time during which an erase voltage is actually applied (i.e., actual application time of the erase voltage). Further, the operation threshold value OFth may be the threshold application time of the erase voltage, which is a reference value used for comparison. Alternatively, according to some embodiments, the application time of an additional operating voltage other than the erase voltage may be defined as the operating characteristic value OFV.

Figure 4:
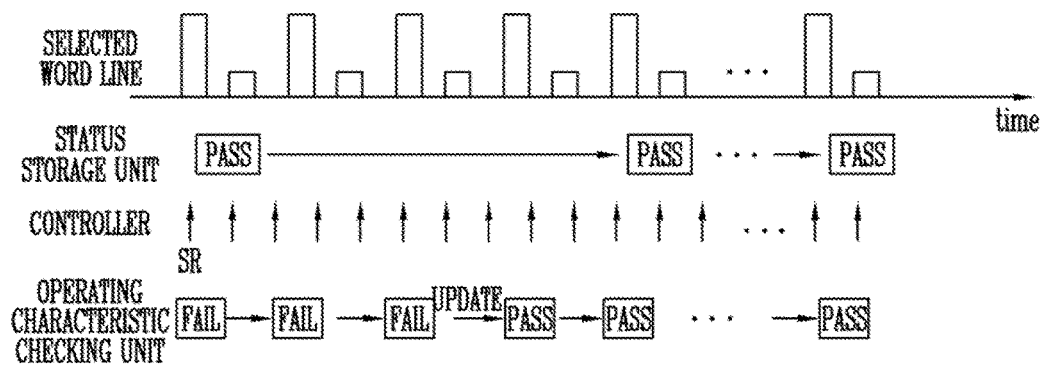
FIG. 4 is a diagram illustrating an example of performing a program operation and testing the operation of a semiconductor memory device according to an embodiment of the present disclosure.

FIG. 4 is a diagram illustrating an example of performing a program operation and testing the program operation of a semiconductor memory device according to an embodiment of the present disclosure.

Referring to FIG. 4, a program pulse and a verification voltage that are applied to a word line coupled to a target memory cell to be programmed, that is, a selected word line, are illustrated. Next, a first status value, stored in the status storage unit 250 depending on a program process, is illustrated. Then, a status read (SR) signal, which is requested by the controller 100 from the semiconductor memory device 200, is illustrated. Finally, a value, actually indicated by an operating characteristic checking result OFR, which is output from the operating characteristic checking unit 270, is illustrated.

It can be seen that a program pulse having a relatively high voltage value and a verification voltage having a relatively low value are repeatedly applied through the selected word line. Referring to FIG. 4, a case in which a program operation is normally performed on the target memory cell to be programmed is depicted. Accordingly, the value stored in the status storage unit 250 is maintained at a value of "PASS", indicating an operation success, without change. Furthermore, the controller 100 repeatedly checks the value stored in the status storage unit 250 using the status read (SR) operation.

Moreover, a second status value, which is output from the operating characteristic checking unit 270, is a value of "FAIL" indicating an operation failure at the beginning of a program operation. The reason for this is that the value of the program pulse, which is actually applied to the selected word line, is less than an operation threshold value OFth stored in the operation threshold storage unit 271. In an embodiment of FIG. 4, as an example the operation threshold value OFth is "4". In this case, the second status value, which is output from the operating characteristic checking unit 270, indicates "FAIL" until the program pulse is applied three times. As the program pulse is applied fourthly, the second status value, which is output from the operating characteristic checking unit 270, may be updated with a value of "PASS".

At the time at which the program operation is terminated, the first status value stored in the status storage unit 250 is "PASS" indicating that the operation has been normally performed, and the operating characteristic checking result OFR output from the operating characteristic checking unit 270 is also "PASS" indicating that the operation has been normally performed. The operating characteristic checking result OFR is transferred as the second status value to the control logic 230. Therefore, since both the first status value and the second status value are values indicating an operation success, it may be determined that the program operation has been normally performed.

Figure 5:
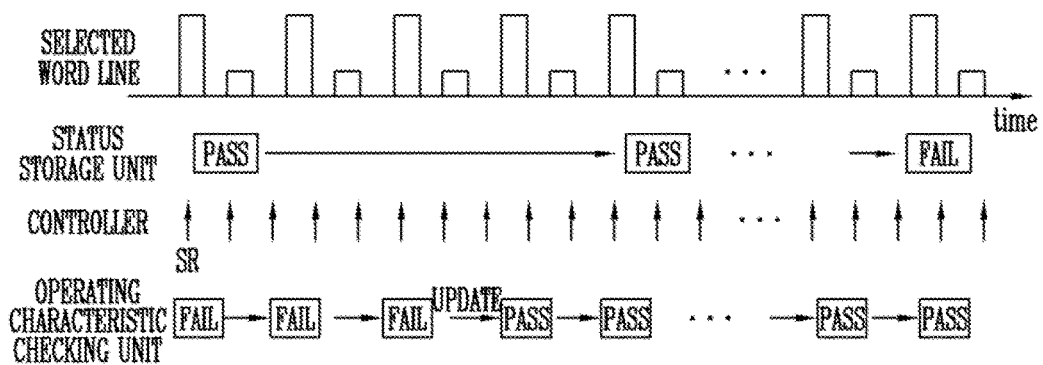
FIG. 5 is a diagram illustrating an example of performing a program operation and testing the operation of a semiconductor memory device according to an embodiment of the present disclosure.

FIG. 5 is a diagram illustrating an example of performing a program operation and testing the program operation of a semiconductor memory device according to an embodiment of the present disclosure.

Similar to FIG. 4, referring to FIG. 5, a program pulse and a verification voltage that are applied to a word line coupled to a target memory cell to be programmed, that is, a selected word line, are illustrated. Next, a first status value, stored in the status storage unit 250 depending on a program process, is illustrated. Then, a status read (SR) signal, which is requested by the controller 100 from the semiconductor memory device 200, is illustrated. Finally, a value, actually indicated by an operating characteristic checking result OFR, which is output from the operating characteristic checking unit 270, is illustrated. FIG. 5 illustrates a situation in which the target memory cell does not pass a program verification until a program pulse is applied a maximum number of times, and, consequently, the program operation is not normally terminated. The value stored in the status storage unit 250 may be initially designated as a value of "PASS", and may then be converted into a value of "FAIL" since it does not reach a desired program status when the program operation is terminated. Furthermore, in the same manner as that of FIG. 4, the value of the operating characteristic checking unit 270 is updated with a value of "PASS" from "FAIL" at the time at which a fourth program pulse is applied.

At the time at which the program operation is terminated, the first status value stored in the status storage unit 250 is "FAIL" indicating that the operation has not been normally completed, and the operating characteristic checking result OFR output from the operating characteristic checking unit 270 is "PASS" indicating that the operation has been normally performed. The operating characteristic checking result OFR is transferred as a second status value to the control logic 230. Therefore, since the first status value is a value indicating an operation failure, it may be finally determined that the program operation has failed.

Figure 6:
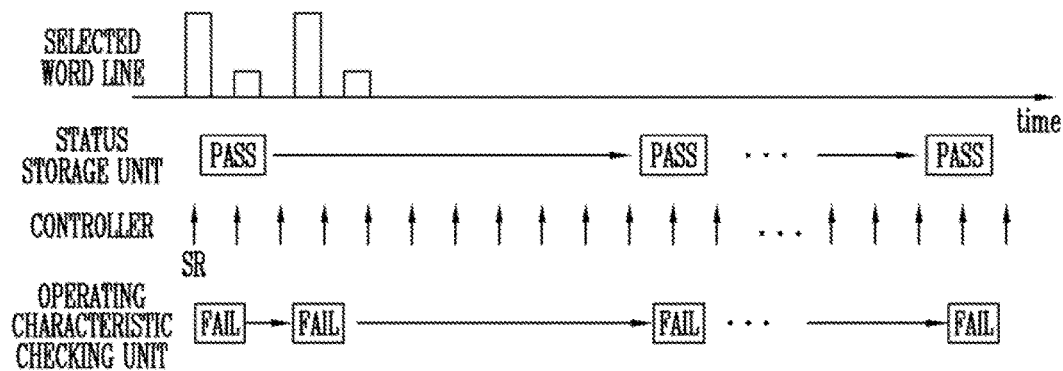
FIG. 6 is a diagram illustrating an example of performing a program operation and testing the operation of a semiconductor memory device according to an embodiment of the present disclosure.

FIG. 6 is a diagram illustrating an example of performing a program operation and testing the operation of a semiconductor memory device according to an embodiment of the present disclosure.

Similar to FIG. 4, referring to FIG. 6, a program pulse and a verification voltage that are applied to a word line coupled to a target memory cell to be programmed, that is, a selected word line, are illustrated. Next, a first status value, stored in the status storage unit depending on a program process, is illustrated. Then, a status read (SR) signal, which is requested by the controller 100 from the semiconductor memory device 200, is illustrated. Finally, a value, actually indicated by an operating characteristic checking result OFR, which is output from the operating characteristic checking unit 270, is illustrated.

FIG. 6 illustrates a specific case, for example, a situation in which the first status value stored in the status storage unit 250 is maintained at a value of "PASS" indicating an "operation success" even if the program operation is not normally completed due to a cause such as an insufficient supply of a power supply voltage. The reason for this is that the initial value of the status storage unit 250 is initially stored as a value indicating an "operation success" other than "operation failure", and that when an "operation failure" is definitely detected, the value stored in the status storage unit 250 is updated. Consequently, although the program pulse is applied a number of times less than a typical number of times and then the program operation has failed, the first status value stored in the status storage unit 250 has a value indicating an "operation success".

In a conventional semiconductor memory device, the controller 100 refers only to the first status value in the above-described situation. Accordingly, even if the program operation is not normally completed, the status is recognized as an "operation success", and then a subsequent operation is performed. In this case, a follow-up action for the abnormally terminated program operation is not taken, thus deteriorating the reliability of the semiconductor memory device. In the semiconductor memory device according to the present disclosure, the operating characteristic checking unit 270 may additionally generate a second status value based on the operating characteristic value OFV for the program operation and the operation threshold value OFth, and may determine the final status of the program operation based on both the first status value and the second status value, thus improving the reliability of the semiconductor memory device.

Referring back to FIG. 6, the program pulse that is the operating characteristic value OFV is applied only twice. As an example, the operation threshold value OFth stored in the operation threshold storage unit 271 is 4. Since the number of applications of the program pulse is less than the operation threshold value, the threshold comparison unit 273 of the operating characteristic checking unit 270 outputs a value indicating an operation failure, that is, "FAIL", as the operating characteristic checking result OFR. Since the number of applications of the program pulse does not exceed 2 until the program operation is terminated, the operating characteristic checking result OFR indicating "FAIL" is maintained.

At the time at which the program operation is terminated, the first status value stored in the status storage unit 250 is "PASS" indicating that the operation has been normally completed, but this value is a false value that is not updated due to a specific problem. Furthermore, at the time at which the program operation is terminated, the operating characteristic checking result OFR output from the operating characteristic checking unit 270 is "FAIL" indicating that the operation has not been normally performed. The operating characteristic checking result OFR is transferred as the second status value to the control logic 230. Even if the first status value is a value indicating an operation success, the second status value is a value indicating an operation failure, and thus it may be finally determined that the program operation has failed.

Figure 7:
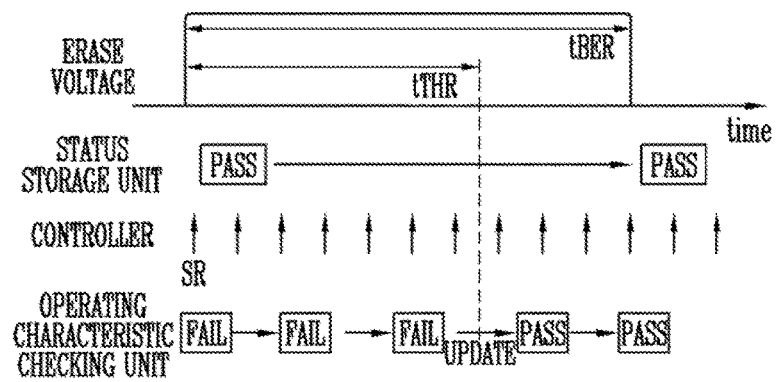
FIG. 7 is a diagram illustrating an example of performing an erase operation and testing the operation of a semiconductor memory device according to other embodiments of the present disclosure.

FIG. 7 is a diagram illustrating an example of performing an erase operation and testing the erase operation of a semiconductor memory device according to other embodiments of the present disclosure.

Unlike FIG. 4, referring to FIG. 7, an erase voltage applied for an erase operation is illustrated. Next, a first status value stored in the status storage unit depending on an erase process is illustrated. Then, a status read (SR) signal which is requested by the controller 100 from the semiconductor memory device 200 is illustrated. Finally, a value, actually indicated by the operating characteristic checking result OFR, which is output from the operating characteristic checking unit 270, is illustrated.

Since the operation illustrated in FIG. 7 is an erase operation, the operating characteristic value OFV is the time tBER during which an erase voltage is actually applied, and the operation threshold value OFth is the threshold application time tTHR of the erase voltage. FIG. 7 illustrates a situation in which the erase voltage is applied during a time longer than the threshold application time tTHR, and thus the erase operation is normally completed. Since the erase operation is normally completed, the first status value stored in the status storage unit 250 is maintained at an initially set value indicating "PASS". Moreover, the second status value output from the operating characteristic checking unit 270 is maintained at a value of "FAIL" at the beginning of the erase operation. Thereafter, at the time at which the time tBER during which the erase voltage is actually applied becomes equal to the threshold application time tTHR, the second status value is updated with a value of "PASS".

At the time at which the erase operation is terminated, the first status value stored in the status storage unit 250 is "PASS" indicating that the operation has been normally completed, and the operating characteristic checking result OFR output from the operating characteristic checking unit 270 is also "PASS" indicating that the operation has been normally performed. The operating characteristic checking result OFR is transferred as the second status value to the control logic 230. Since the first status value and the second status value are values indicating an operation success, it may be finally determined that the erase operation has succeeded.

If, unlike the situation illustrated in FIG. 7, the supply of power related to the erase voltage is not desirably performed, and the erase operation is terminated in a state in which the time tBER during which the erase voltage is actually applied is shorter than the threshold application time tTHR, the second status value output from the operating characteristic checking unit 270 may be maintained at the initial value of "FAIL" without being updated. Therefore, even if the first status value stored in the status storage unit 250 is a value indicating "PASS" due to some errors, it may be finally determined that the erase operation has failed.

In the above description, although the description has been made based on the operation of the semiconductor memory device according to embodiments of the present disclosure, a method for operating the semiconductor memory device according to other embodiments of the present disclosure may also be understood. In greater detail, a procedure of transferring the first status value, stored in the status storage unit 250, to the controller 100 using a status read (SR) operation, and then checking the operational status of the semiconductor memory device may be designated as a first sub-checking step. Furthermore, a procedure of comparing, by the operating characteristic checking unit 270, the operating characteristic value OFV of the semiconductor memory device with a pre-stored operation threshold value OFth, and then checking the operational status of the semiconductor memory device may be designated as a second sub-checking step. In accordance with the method for operating the semiconductor memory device according to an embodiment of the present disclosure, the operational status of the semiconductor memory device is determined based on the results of the first sub-checking step and the second sub-checking step. At the first sub-checking step, the above-described first status value is checked. Further, at the second sub-checking step, the above-described second status value is checked. According to an embodiment of the present disclosure, it may be finally determined that the operation of the semiconductor memory device has been normally completed only when the first status value is a value indicating an "operation success", and the second status value is a value indicating an "operation success". When at least one of the first status value and the second status value is a value indicating an "operation failure", it may be finally determined that the operation of the semiconductor memory device has failed. The first sub-checking step and the second sub-checking step may be sequentially performed, and they may also be simultaneously performed in parallel.

As described above, in accordance with the semiconductor memory device and the method for operating the semiconductor memory device according to embodiments of the present disclosure, the operational status may be more precisely checked even when the first status value has an error, by not only checking the first status value stored in the status storage unit 250, but also checking the second status value based on the operating characteristic value OFV through the operating characteristic checking unit 270. Accordingly, the reliability of the operation of the semiconductor memory device may be improved.

Figure 8:
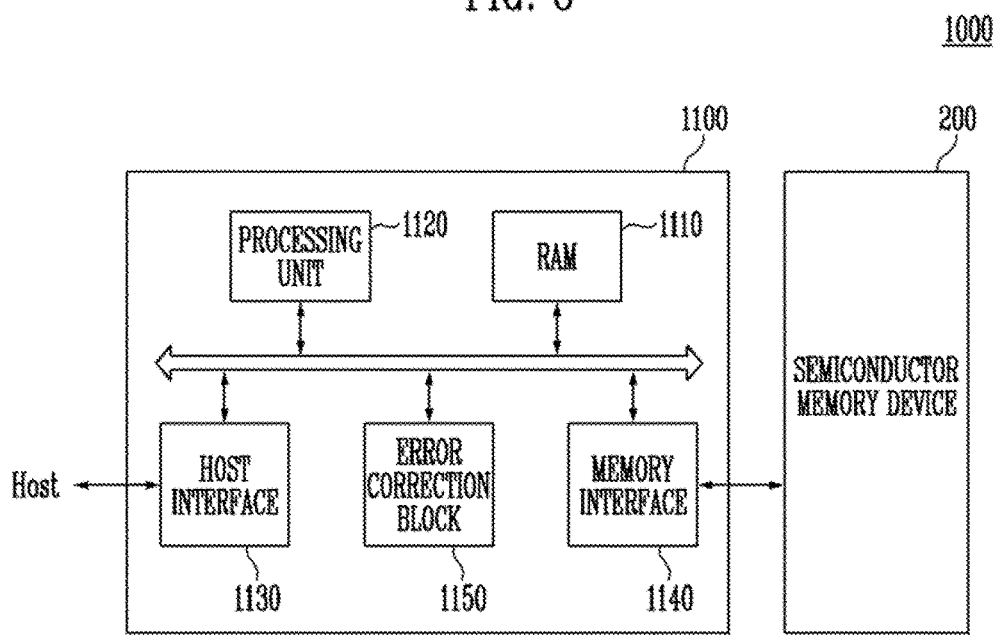
FIG. 8 is a block diagram illustrating a memory system including the semiconductor memory device of FIG. 2.

FIG. 8 is a block diagram illustrating a memory system 1000 including the semiconductor memory device 200 of FIG. 2.

Referring to FIG. 8, the memory system 1000 may include the semiconductor memory device 200 and a controller 1100. The semiconductor memory device 200 may be the semiconductor memory device described with reference to FIG. 2. Hereinafter, repetitive descriptions will be omitted.

The controller 1100 may be coupled between a host Host and the semiconductor memory device 200. The controller 1100 is configured to access the semiconductor memory device 200 in response to a request from the host Host. For example, the controller 1100 may control read, write, erase, and background operations of the semiconductor memory device 200. The controller 1100 may provide an interface between the host Host and the semiconductor memory device 200. The controller 1100 is configured to run firmware for controlling the semiconductor memory device 200.

The controller 1100 may include a random access memory (RAM) 1110, a processing unit 1120, a host interface 1130, a memory interface 1140, and an error correction block 1150. The RAM 1110 may be used as at least one of an operation memory of the processing unit 1120, a cache memory between the semiconductor memory device 200 and the host Host, and a buffer memory between the semiconductor memory device 200 and the host Host. The processing unit 1120 may control the overall operation of the controller 1100. In addition, the controller 1100 may temporarily store program data provided from the host Host in the semiconductor memory device 200 during the write operation.

The host interface 1130 may include a protocol for performing data exchange between the host Host and the controller 1100. In an example of an embodiment, the controller 1100 may communicate with the host Host through at least one of various interface protocols such as a universal serial bus (USB) protocol, a multimedia card (MMC) protocol, a peripheral component interconnection (PCI) protocol, a PCI express (PCIe) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 may interface with the semiconductor memory device 200. For example, the memory interface 1140 may include a NAND interface or a NOR interface.

The error correction block 1150 uses an error correcting code (ECC) to detect and correct an error in data received from the semiconductor memory device 200. The processing unit 1120 may adjust the read voltage according to an error detection result from the error correction block 1150, and control the semiconductor memory device 200 to perform re-reading. In an example of an embodiment, the error correction block may be provided as an element of the controller 1100.

The controller 1100 and the semiconductor memory device 200 may be integrated into a single semiconductor device. In an example of an embodiment, the controller 1100 and the semiconductor memory device 200 may be integrated into a single semiconductor device to form a memory card. For example, the controller 1100 and the semiconductor memory device 200 may be integrated into a single semiconductor device and form a memory card such as a personal computer memory card international association (PCMCIA), a compact flash card (CF), a smart media card (e.g., SM or SMC), a memory stick multimedia card (e.g., MMC, RS-MMC, or MMCmicro), a SD card (e.g., SD, miniSD, microSD, or SDHC), a universal flash storage (UFS), and the like.

The controller 1100 and the semiconductor memory device 200 may be integrated into a single semiconductor device to form a solid state drive (SSD). The SSD may include a storage device formed to store data in a semiconductor memory. When the memory system 1000 is used as the SSD, an operation speed of the host Host coupled to the memory system 1000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, a radio frequency identification (RFID) device, one of various elements for forming a computing system, or the like.

In an embodiment, the semiconductor memory device 200 or the memory system 1000 may be embedded in various types of packages. For example, the semiconductor memory device 200 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 9:
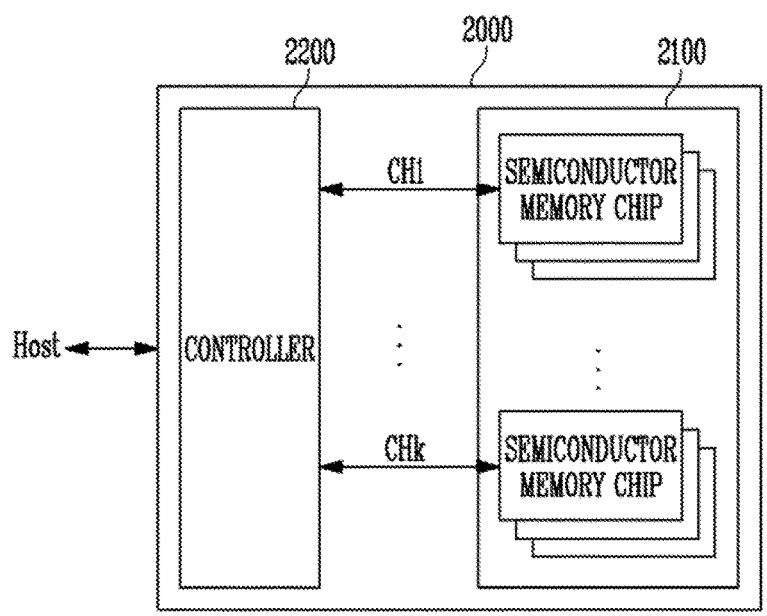
FIG. 9 is a block diagram illustrating an example of application of the memory system of FIG. 8.

FIG. 9 is a block diagram illustrating an example of application of a memory system of FIG. 8.

Referring to FIG. 9, a memory system 2000 may include a semiconductor memory device 2100 and a controller 2200. The semiconductor memory device 2100 may include a plurality of memory chips. The semiconductor memory chips are divided into a plurality of groups.

Referring to FIG. 9, it is illustrated that each of the plurality of groups communicates with the controller 2200 through first to k-th channels CH1 to CHk. Each semiconductor memory chip may have the same configuration and operation as those of an embodiment of the semiconductor memory device 200 described with reference to FIG. 2.

Each group may communicate with the controller 2200 through one common channel. The controller 2200 may have the same configuration as the controller 1100 described with reference to FIG. 8 and may be configured to control a plurality of memory chips of the semiconductor memory device 2100 through the plurality of channels CH1 to CHk.

Figure 10:
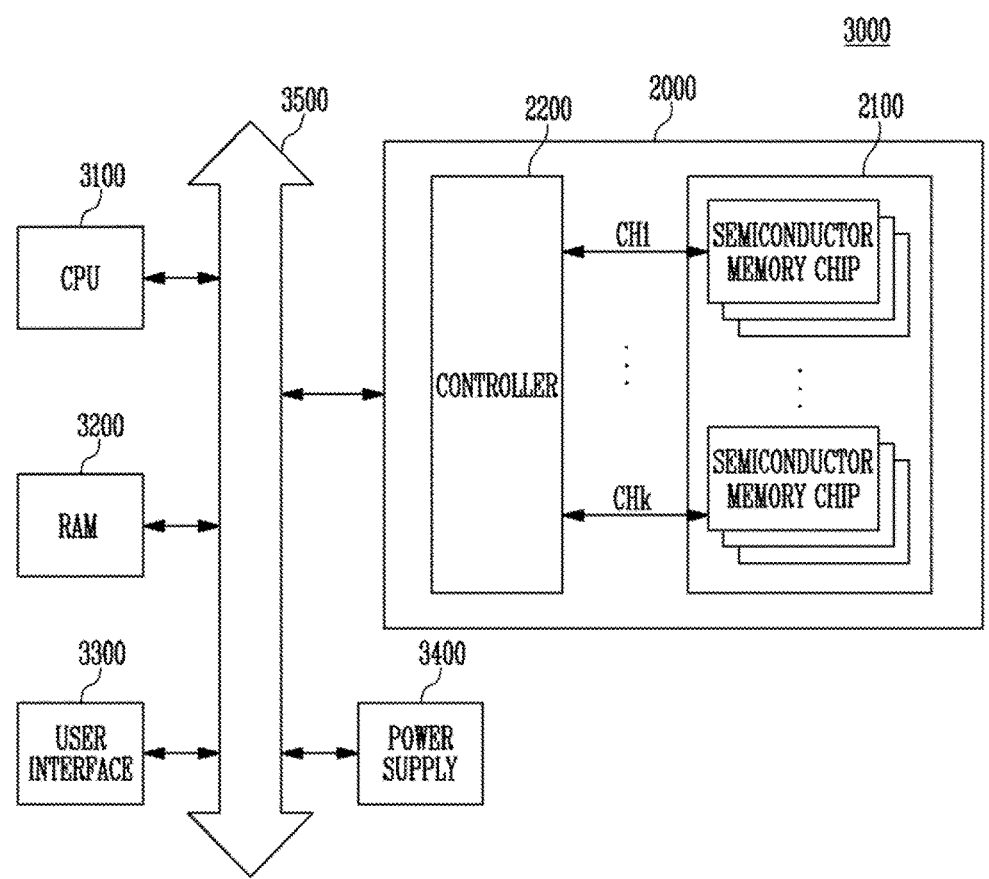
FIG. 10 is a block diagram illustrating a computing system including the memory system described with reference to FIG. 9.

FIG. 10 is a block diagram illustrating a computing system 3000 including a memory system 2000 described with reference to FIG. 9.

Referring to FIG. 10, the computing system 3000 may include a central processing unit (CPU) 3100, a random access memory (RAM) 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 10, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 10, the memory system 2000 described with reference to FIG. 9 is illustrated as being provided. However, the memory system 2000 may be replaced with the memory system 1000 described with reference to FIG. 8. In an embodiment, the computing system 3000 may include all of the memory systems 1000 and 2000 described with reference to FIGS. 8 and 9.

According to an embodiment of the present disclosure, a semiconductor memory device that is capable of improving the reliability of operation may be provided.

According to other embodiments of the present disclosure, a method for operating the semiconductor memory device that is capable of improving the reliability of operation may be provided.

Examples of embodiments have been disclosed herein, and although specific terms are employed, the terms are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device, comprising:
   a memory cell array including a plurality of memory cells;
   a peripheral circuit configured to perform a data write operation, a data read operation or a data erase operation on the memory cell array;
   a status storage unit configured to generate a first status value indicating whether a status of an operation on the memory cell array is pass or fail;
   an operating characteristic checking unit configured to generate a second status value as pass or fail according to whether an operating characteristic value depending on the operation on the memory cell array exceeds an operation threshold value; and
   a control logic configured to change the first status value to fail if the first status value is pass and the second status value is fail, and to output the first status value in response to a request of a controller controlling the semiconductor memory device,
   wherein the operating characteristic value is a number of applications of an operation pulse for the operation of the memory cell array or an application time of an operating voltage for the operation on the memory cell array.

2. The semiconductor memory device according to claim 1, wherein when the first status value is a value indicating an operation success, and the second status value is a value indicating an operation success, the operation on the memory cell array is determined to have succeeded.

3. The semiconductor memory device according to claim 1, wherein when any one of the first status value and the second status value is a value indicating an operation failure, the operation on the memory cell array is determined to have failed.

4. The semiconductor memory device according to claim 1, wherein the first status value is output to the controller using a status read operation.

5. The semiconductor memory device according to claim 1, wherein the operating characteristic checking unit comprises:
   an operation threshold storage unit configured to store the operation threshold value; and
   a threshold comparison unit configured to receive the operating characteristic value, and generate an operating characteristic checking result by comparing the received operating characteristic value with the operation threshold value.

6. The semiconductor memory device according to claim 5, wherein the threshold comparison unit outputs the operating characteristic checking result as the second status value.

7. The semiconductor memory device according to claim 5, wherein:
   the operating characteristic value includes the number of applications of the operation pulse for the operation of the memory cell array, and the operation threshold value includes a threshold number of applications of the operation pulse, and
   the threshold comparison unit is configured to:
   output a value indicating an operation failure as the second status value when the number of applications of the operation pulse is less than the threshold number of applications, and
   output a value indicating an operation success as the second status value when the number of applications of the operation pulse is equal to or greater than the threshold number of applications.

8. The semiconductor memory device according to claim 7, wherein:
   the status of the operation includes a status of a program operation of the memory cell array,
   the operation pulse is a program pulse that is applied for the program operation of the memory cell array,
   the operating characteristic value includes a number of applications of the program pulse, and
   the operation threshold value includes a threshold number of applications of the program pulse.

9. The semiconductor memory device according to claim 5, wherein:
   the operating characteristic value includes the application time of the operating voltage for the operation on the memory cell array, and the operation threshold value includes a threshold application time of the operating voltage, and
   the threshold comparison unit is configured to:
   output a value indicating an operation failure as the second status value when the application time of the operating voltage is shorter than the threshold application time, and
   output a value indicating an operation success as the second status value when the application time of the operating voltage is equal to or longer than the threshold application time.

10. The semiconductor memory device according to claim 9, wherein:
the status of the operation includes a status of an erase operation of the memory cell array,
the operating voltage is an erase voltage that is applied to erase data written to the memory cell array,
the operating characteristic value includes an application time of the erase voltage, and
the operation threshold value includes a threshold application time of the erase voltage.

11. The semiconductor memory device according to claim 1, wherein the first status value and the second status value are output in response to a request signal from an external controller.

12. The semiconductor memory device according to claim 1, wherein when the first status value is a value indicating an operation success, and the second status value is a value indicating an operation failure, the control logic converts the first status value into a value indicating an operation failure in response to a request signal from an external controller, and outputs the converted first status value to the controller.

13. A method for operating a semiconductor memory device, comprising:
generating a first status value indicating whether a state of an operation is pass or fail;
generating a second status value indicating whether a state of an operation is pass or fail according to whether an operating characteristic value depending on the operation exceeds an operation threshold value; and
outputting a changed first status value from pass to fail if the first status value is pass and the second status value is fail according to a request of a memory controller controlling the semiconductor memory device.

14. The method according to claim 13, wherein the operation is a program operation or an erase operation on the semiconductor memory device.

15. The method according to claim 13, wherein the operation threshold value is a number of applications of an operation pulse for the operation or an application time of an operating voltage for the operation.

16. The method according to claim 15, wherein the operation pulse is a program pulse for programming data in the semiconductor memory device and the operating voltage is an erase voltage that is applied to erase data written to the memory cell in the semiconductor memory device.

17. The method according to claim 13, wherein the operating characteristic value is a number of applications of an operation pulse for the operation or an application time of an operating voltage for the operation.

18. The method according to claim 15, wherein the first status value is output to the controller using a status read operation.

19. The method according to claim 15, wherein if the number of applications of the operation pulse for the operation exceeds the operation threshold value, the state of the operation is pass, and otherwise, the state of the operation is fail.

20. The method according to claim 15, wherein if the application time of the operating voltage for the operation exceeds the operation threshold value, the state of the operation is pass, and otherwise, the state of the operation is fail.

* * * * *